United States Patent
Fukushima

(10) Patent No.: US 10,283,395 B2
(45) Date of Patent: May 7, 2019

(54) SUBSTRATE GRIPPING HAND AND SUBSTRATE TRANSFER APPARATUS

(71) Applicant: KAWASAKI JUKOGYO KABUSHIKI KAISHA, Kobe-shi, Hyogo (JP)

(72) Inventor: Takayuki Fukushima, Takarazuka (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 0 days.

(21) Appl. No.: 16/080,108

(22) PCT Filed: Feb. 20, 2017

(86) PCT No.: PCT/JP2017/006137
§ 371 (c)(1),
(2) Date: Aug. 27, 2018

(87) PCT Pub. No.: WO2017/145986
PCT Pub. Date: Aug. 31, 2017

(65) Prior Publication Data
US 2019/0067075 A1    Feb. 28, 2019

(30) Foreign Application Priority Data
Feb. 26, 2016 (JP) .................. 2016-036034

(51) Int. Cl.
*H01L 21/677* (2006.01)
*H01L 21/687* (2006.01)
(Continued)

(52) U.S. Cl.
CPC ..... *H01L 21/68707* (2013.01); *B25J 11/0095* (2013.01); *B25J 15/0014* (2013.01);
(Continued)

(58) Field of Classification Search
CPC ......... H01L 21/67742; H01L 21/67766; H01L 21/67796; H01L 21/68707;
(Continued)

(56) References Cited

U.S. PATENT DOCUMENTS 7,644,968 B2 * 1/2010 Hirooka ............ H01L 21/68707
294/103.1
8,444,194 B2 * 5/2013 Furuichi ........... H01L 21/68707
294/213
(Continued)

FOREIGN PATENT DOCUMENTS

JP        2002-141405 A    5/2002

*Primary Examiner* — Dean J Kramer
(74) *Attorney, Agent, or Firm* — Oliff PLC

(57) ABSTRACT

A substrate gripping hand includes: a base plate wherein a center line and gripping position are prescribed; at least one fixed claw capable of mating with a substrate edge in the gripping position and provided at a base plate distal end side; a movable claw having an acting portion acting on a substrate edge in gripping position and movable back-and-forth on center line; a pusher having an acting portion acting on an edge lower than the substrate center in a perpendicular orientation and movable back-and-forth parallel with the center line; and an actuator for moving the movable claw and pusher. The pusher acting portion is positioned more to the distal end side than the movable claw acting portion such that the substrate is grasped by the movable claw joint operation and the fixed claw after the substrate is brought to gripping position by the pusher moving forward toward the distal end side.

4 Claims, 9 Drawing Sheets

(51) Int. Cl.
*B25J 11/00* (2006.01)
*B25J 15/00* (2006.01)

(52) U.S. Cl.
CPC .. *H01L 21/67766* (2013.01); *H01L 21/67796* (2013.01); *H01L 21/68742* (2013.01)

(58) Field of Classification Search
CPC ............. H01L 21/68742; B25J 11/0095; B25J 15/0014; Y10S 414/141
USPC .............................................. 294/213, 103.1
See application file for complete search history.

(56) References Cited

U.S. PATENT DOCUMENTS

| | | | | |
|---|---|---|---|---|
| 8,454,068 B2* | 6/2013 | Hashimoto | .............. | B25J 15/00 294/103.1 |
| 2002/0071756 A1* | 6/2002 | Gonzalez | .......... | H01L 21/68707 294/213 |
| 2011/0241367 A1* | 10/2011 | Hosek | ............... | H01L 21/67742 294/213 |
| 2016/0303742 A1* | 10/2016 | Embertson | ........ | H01L 21/68707 |

* cited by examiner

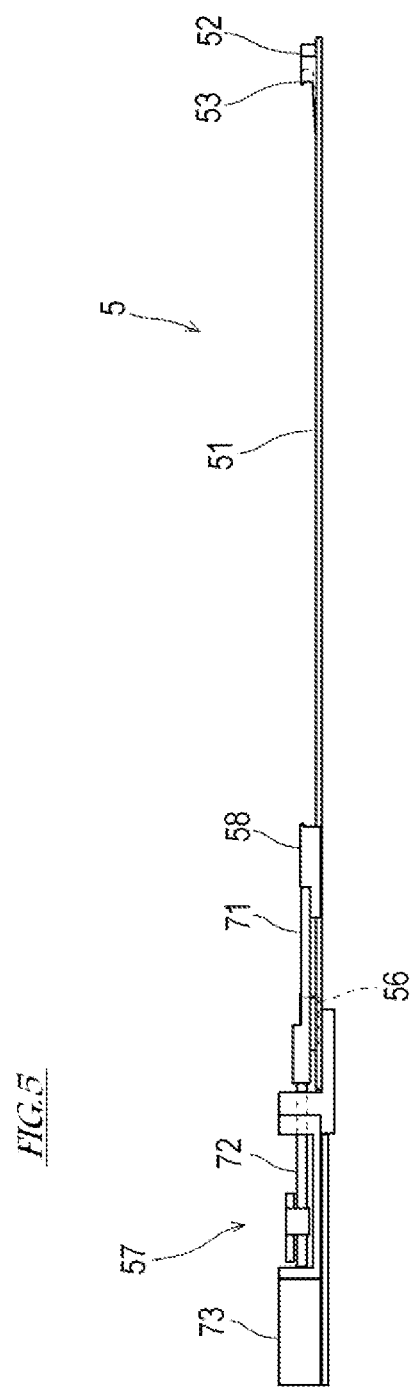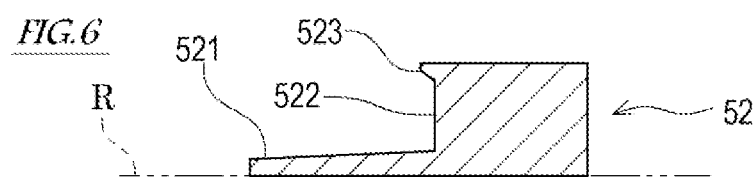

SUBSTRATE GRIPPING HAND AND SUBSTRATE TRANSFER APPARATUS

TECHNICAL FIELD

The present invention relates to a substrate gripping hand for gripping the edge portion of a disc-shaped substrate and a substrate transfer apparatus including the substrate gripping hand.

BACKGROUND ART

Conventionally, there is a known substrate transfer apparatus that includes: a hand configured to grip the edge portion of a semiconductor substrate, from which a semiconductor device substrate is produced; and a manipulator to which the hand is attached. For example, Patent Literature 1 proposes a substrate transfer apparatus of such kind, which is configured to transfer a substrate in a vertical orientation. The "vertical orientation" herein means the orientation in which the main surface of the substrate faces substantially in the horizontal direction (i.e., the main surface of the substrate extends vertically).

The substrate transfer apparatus described in Patent Literature 1 includes a chuck hand capable of: retrieving and feeding a substrate in a vertical orientation; and retrieving and feeding a substrate in a horizontal orientation. The chuck hand includes: a flat plate member; at least one fixed engagement member engageable with the edge of a substrate; at least one movable engagement member; and at least one auxiliary engagement member. The movable engagement member and the auxiliary engagement member are movable toward the center of the substrate in a reciprocating manner, and are operated by separate drive units, respectively. The auxiliary engagement member engages with the substrate at a position close to an engagement position where the movable engagement member engages with the substrate.

In a case where the chuck hand thus configured retrieves a substrate in a vertical orientation from a groove in which the substrate is placed, first, the orientation of the chuck hand is controlled such that the movable engagement member is positioned below the substrate, and also, the chuck hand is moved to a position corresponding to the substrate. At the time, it is not always the case that a groove of the movable engagement member is facing the edge portion of the substrate with no positional error. Therefore, first, the fixed engagement member and the substrate are brought into engagement with each other. While keeping this engagement state, the auxiliary engagement member is moved forward and brought into engagement with the substrate, and thereby supplementary gripping of the substrate is achieved by the auxiliary engagement member and the fixed engagement member. Thereafter, the movable engagement member is moved forward, and thereby the substrate is gripped by the movable engagement member and the fixed engagement member. Thus, even if there is a positional error between the groove in which the substrate is placed and the groove of the movable engagement member, since the auxiliary engagement member is present between these grooves, the substrate can be fed and received between these grooves without causing local strain in the substrate.

CITATION LIST

Patent Literature

PTL 1: Japanese Laid-Open Patent Application Publication No. 2002-141405

SUMMARY OF INVENTION

Technical Problem

In the above-described substrate transfer apparatus of Patent Literature 1, the movable engagement member and the auxiliary engagement member operate independently of each other. For this reason, the movable engagement member and the auxiliary engagement member are provided with separate drive units, respectively. Therefore, it is necessary to perform complex control such that each drive unit operates at a suitable timing, and it is also necessary to supply energy to each drive unit. In these respects, there is still room for improvement in the substrate transfer apparatus of Patent Literature 1.

Solution to Problem

A substrate gripping hand according to one aspect of the present invention is a substrate gripping hand for gripping a disc-shaped substrate, and the substrate gripping hand includes: a base plate on which a center line and a gripping position are defined, the center line extending from a proximal end side to a distal end side, the gripping position being such a position that when the substrate is positioned at the gripping position, a center of the substrate is positioned on the center line; at least one fixed claw provided on the base plate at the distal end side, the fixed claw being engageable with an edge of the substrate positioned at the gripping position; a movable claw that includes an acting portion operable to act on the edge of the substrate positioned at the gripping position, the movable claw moving in a reciprocating manner on the center line at a position that is shifted from the gripping position to the proximal end side; a pusher that includes an acting portion operable to act on a lower edge of the substrate in a vertical orientation, the lower edge being lower than the center of the substrate, the pusher moving parallel to the center line in a reciprocating manner at a position that is shifted from the gripping position to the proximal end side; and an actuator configured to cause the movable claw and the pusher to move integrally in a reciprocating manner. A position of the acting portion of the pusher is shifted to the distal end side relative to a position of the acting portion of the movable claw, such that after the pusher moving forward to the distal end side acts on the substrate in a vertical orientation to lift the substrate to the gripping position, the movable claw moving forward acts on the substrate in such a manner that the movable claw and the fixed claw grip the substrate in cooperation with each other.

A substrate transfer apparatus according to another aspect of the present invention includes: the above-described substrate gripping hand; and a manipulator mounted with the substrate gripping hand, which is attached to a hand end portion of the manipulator.

In the above-described substrate gripping hand and substrate transfer apparatus, in the case of retrieving the substrate placed in a vertical-storage groove in a vertical orientation from the groove, first, the pusher acts on the substrate, and thereby the substrate is lifted until the lifting is restricted by the gripping claw (i.e., lifted to the level of the gripping position). After the substrate has thus moved to the gripping position, the movable claw acts on the substrate in such a manner that the movable claw and the fixed claw grip the substrate in cooperation with each other. Therefore, even if there is a positional error in the vertical direction and/or the horizontal direction between the substrate placed in the vertical-storage groove and the gripping position defined on the substrate gripping hand, such positional error is corrected by the action of the pusher. Accordingly, the movable claw acting on the substrate can exert pushing force toward the center of the substrate. This makes it possible to smoothly retrieve the substrate placed in the vertical-storage groove in a vertical orientation from the groove without causing local strain and twisting of the substrate.

Moreover, since the movable claw and the pusher operate integrally, the timing at which the movable claw acts on the substrate and the timing at which the pusher acts on the substrate are predetermined in relation to each other, and thus the control of the operation of the movable claw and the pusher is simplified. Furthermore, since the movable claw and the pusher are driven by the single actuator, the initial cost and energy consumption of the actuator can be reduced compared to a case where the actuator is provided for each of the movable claw and the pusher. In addition, by thus reducing the components of the substrate gripping hand, the size of the substrate gripping hand and the substrate transfer apparatus can be reduced.

Advantageous Effects of Invention

The present invention realizes improvement in terms of simplifying the control and reducing energy consumption compared to conventional substrate gripping hands and substrate transfer apparatuses.

BRIEF DESCRIPTION OF DRAWINGS

FIG. 5 is a side view of the substrate gripping hand.

FIG. 6 is a sectional view taken along line VI-VI of FIG. 4.

DESCRIPTION OF EMBODIMENTS

Figure 1:
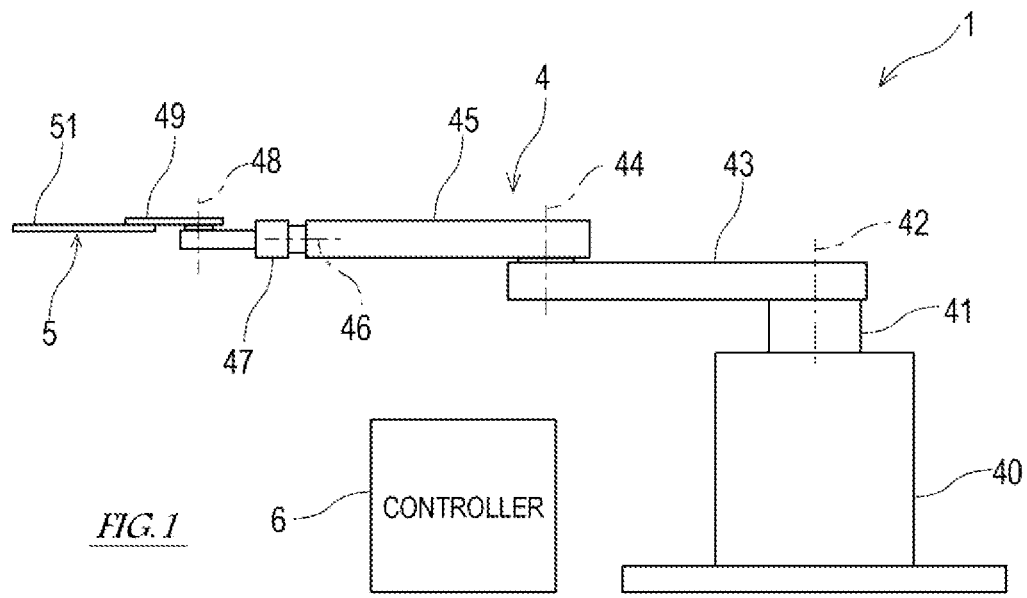
FIG. 1 is a side view of a substrate transfer apparatus according to one embodiment of the present invention, showing a schematic configuration of the substrate transfer apparatus.
Figure 2:
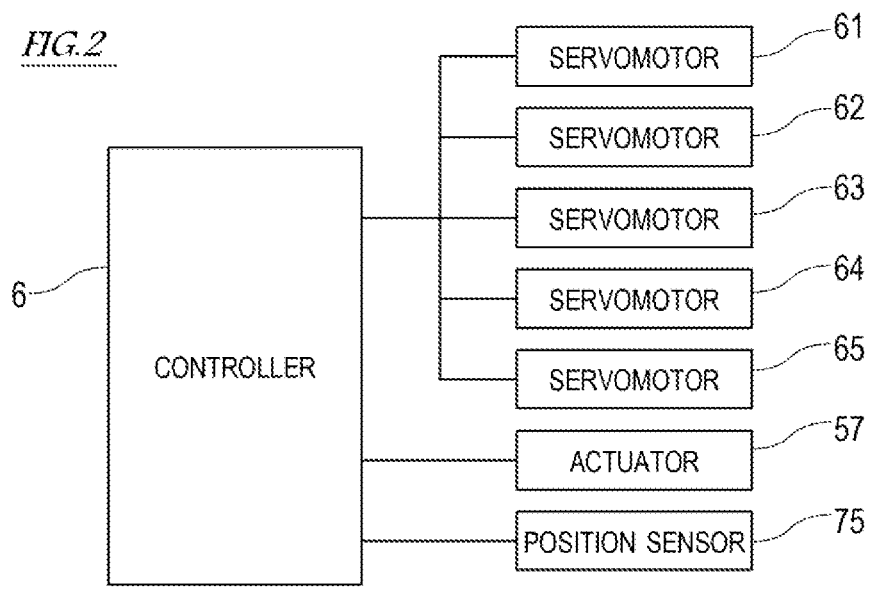
FIG. 2 is a block diagram showing a control configuration of the substrate transfer apparatus.
Figure 3:
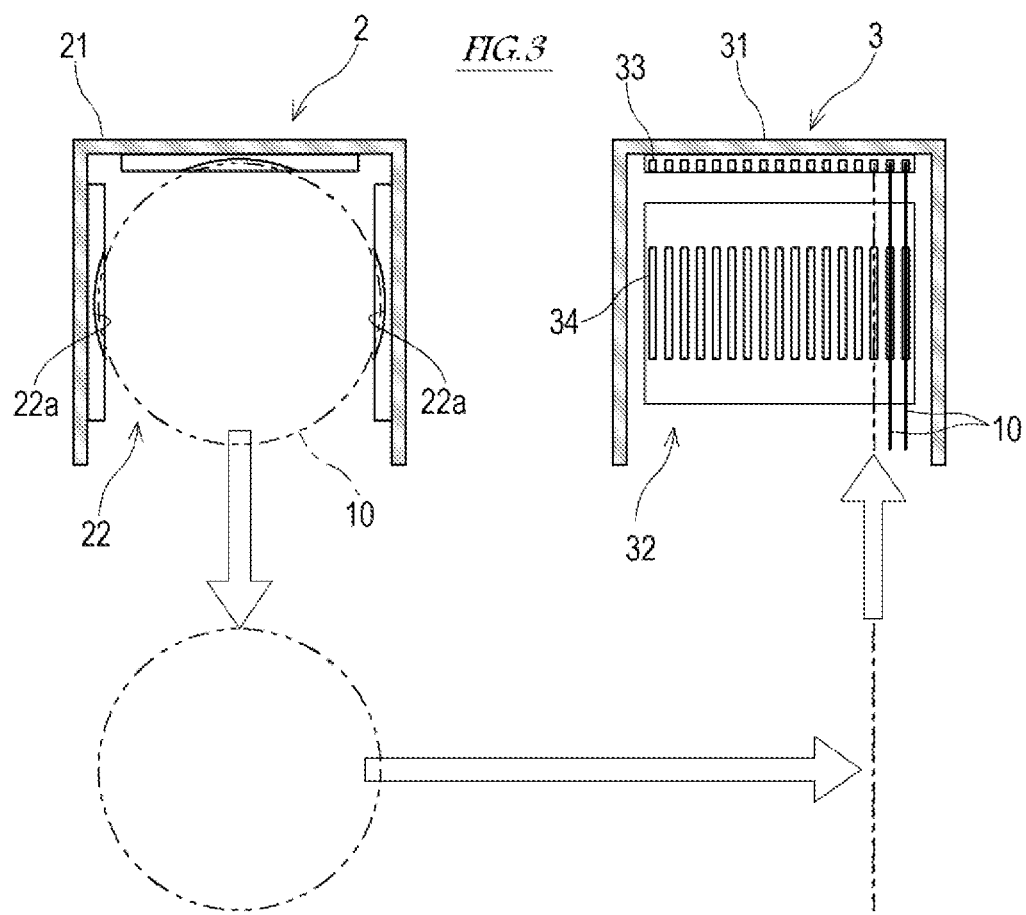
FIG. 3 shows one example of a substrate horizontal-storage container and a substrate vertical-storage container.

Hereinafter, one embodiment of the present invention is described with reference to the drawings. FIG. 1 shows a schematic configuration of a substrate transfer apparatus 1 according to one embodiment of the present invention. FIG. 2 is a block diagram showing a control configuration of the substrate transfer apparatus 1. FIG. 3 shows one example of a substrate horizontal-storage container 2 and a substrate vertical-storage container 3, and FIG. 3 shows a plan view of these containers. The substrate transfer apparatus 1 according to the present embodiment is an apparatus for transferring a disc-shaped substrate 10 between a horizontal-storage groove 22 in the substrate horizontal-storage container 2 and a vertical-storage groove 32 in the substrate vertical-storage container 3.

[Substrate Horizontal-Storage Container 2 and Substrate Vertical-Storage Container 3]

As shown in FIG. 3, the substrate horizontal-storage container 2 and the substrate vertical-storage container 3 are carriers intended for transferring, storing, and performing processing on a plurality of substrates 10 collectively. It should be noted that, in the present invention, each substrate 10 is, for example, a circular thin plate, such as a semiconductor substrate or a glass substrate, from which a semiconductor device substrate is produced. Examples of the semiconductor substrate include a silicon substrate, a sapphire (single crystal alumina) substrate, and other various kinds of substrates. Examples of the glass substrate include a FPD (Flat Panel Display) glass substrate and a MEMS (Micro Electro Mechanical Systems) glass substrate. Examples of the processing performed on the plurality of substrates 10 stored in the substrate horizontal-storage container 2 or the substrate vertical-storage container 3 include various processing treatments, such as thermal treatment, impurity introducing treatment, thin film forming treatment, lithography treatment, cleaning treatment, and flattening treatment.

The substrate horizontal-storage container 2 includes: a box-shaped shell 21, the front side of which is open; and a door (not shown) provided on the front side of the shell 21, the door being openable and closeable. A plurality of horizontal-storage grooves 22 arranged in the up-down direction at regular intervals (e.g., at intervals of 5 to 15 mm) are provided in the substrate horizontal-storage container 2. The plurality of horizontal-storage grooves 22 form horizontal-storage shelves for retaining the substrates 10 in a horizontal orientation (i.e., the orientation in which the main surface of each substrate 10 extends substantially horizontally).

The substrate vertical-storage container 3 includes: a box-shaped shell 31, the front side of which is open; and a door (not shown) provided on the front side of the shell 31, the door being openable and closeable. A plurality of vertical-storage grooves 32 arranged substantially in the horizontal direction at regular intervals (e.g., at intervals of 5 to 15 mm) are provided in the substrate vertical-storage container 3. The plurality of vertical-storage grooves 32 form vertical-storage shelves for retaining the substrates 10 in a vertical orientation (i.e., the orientation in which the main surface of each substrate 10 extends substantially vertically).

[Substrate Transfer Apparatus 1]

As shown in FIGS. 1 and 2, the substrate transfer apparatus 1 includes: a manipulator 4; a substrate gripping hand 5, which is an end effector attached to a hand end portion of the manipulator 4; and a controller 6 configured to control the operation of the substrate transfer apparatus 1. Hereinafter, the components of the substrate transfer apparatus I are described.

[Manipulator 4]

The manipulator 4 of the substrate transfer apparatus 1 according to the present embodiment is a horizontal articulated robot including a turnable wrist 47. However, the manipulator 4 is not limited to a horizontal articulated robot. Alternatively, the manipulator 4 may be based on a vertical articulated robot.

The manipulator 4 includes: a base 40; a lifting/lowering shaft 41 configured to expand and contract in the up-down direction with respect to the base 40; a first link 43 coupled to the lifting/lowering shaft 41, such that the first link 43 is rotatable about a first shaft 42, which extends through the central axis of the lifting/lowering shaft 41; a second link 45 coupled to the distal end of the first link 43, such that the second link 45 is rotatable about a second shaft 44; the wrist 47 coupled to the distal end of the second link 45, such that the wrist 47 is rotatable about a third shaft 46; and a hand base portion 49 coupled to the distal end of the wrist 47, such that the hand base portion 49 is rotatable about a fourth shaft 48. The substrate gripping hand 5 is attached to the hand base portion 49. The first shaft 42 and the second shaft 44 are vertical shafts, and the third shaft 46 is a horizontal shaft. The fourth shaft 48 is orthogonal to the third shaft 46, and the normal orientation of the fourth shaft 48 is a vertical orientation.

The manipulator 4 further includes servomotors 61 to 64 and power transmission mechanisms (not shown) as drive units for causing the first link 43, the second link 45, the wrist 47, and the hand base portion 49 to rotate about the respective shafts. The manipulator 4 further includes a servomotor 65 and a power transmission mechanism (not shown) as a drive unit for causing the lifting/lowering shaft 41 to expand and contract with respect to the base 40. The servomotors 61 to 65 are operated based on control signals outputted from the controller 6.

[Substrate Gripping Hand 5]

Figure 4:
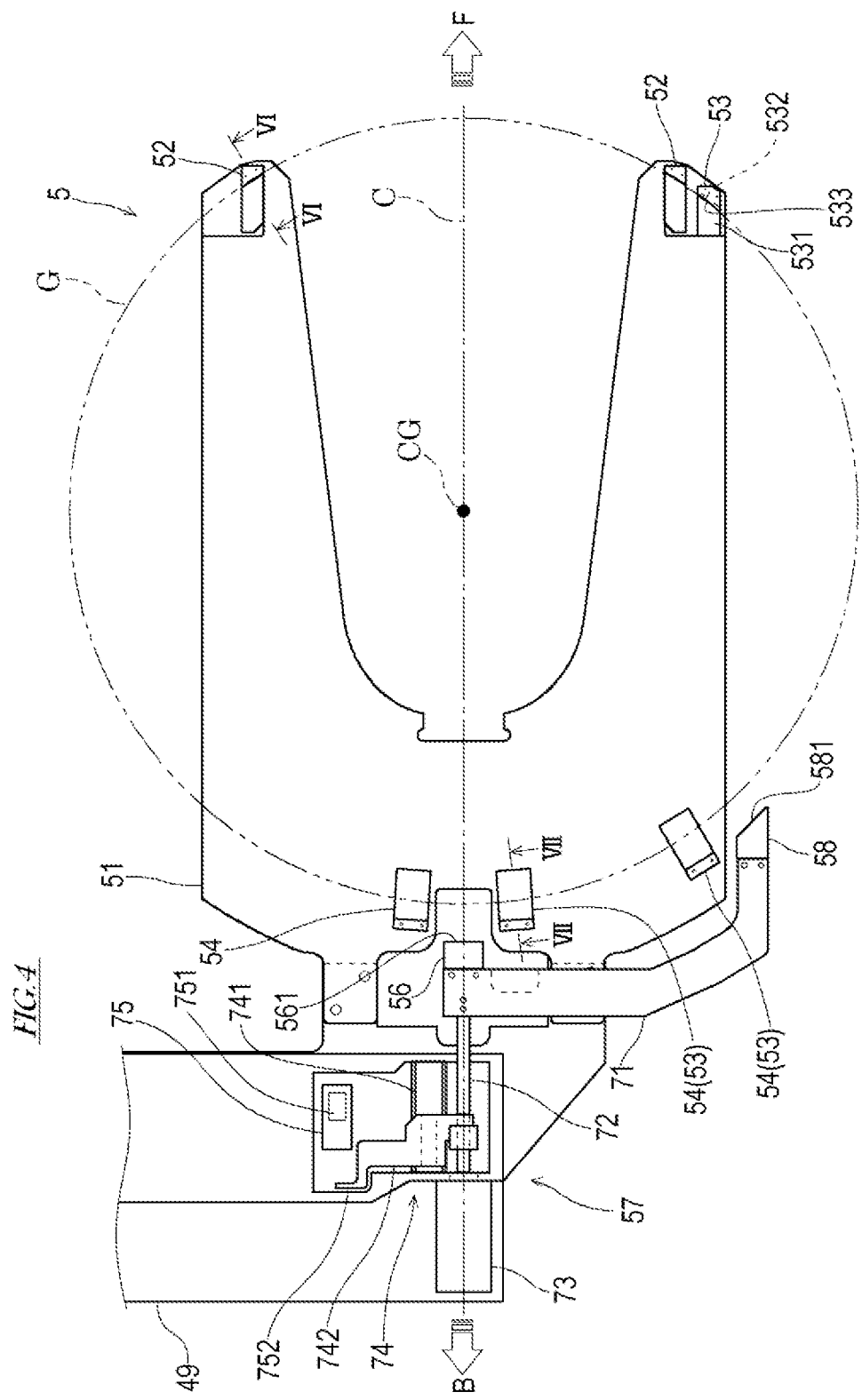
FIG. 4 is a plan view of a substrate gripping hand.

FIG. 4 is a plan view of the substrate gripping hand 5, and FIG. 5 is a side view of the substrate gripping hand. As shown in FIG. 4 and FIG. 5, the substrate gripping hand 5 includes a base plate 51, which is the base portion of the substrate gripping hand 5. An imaginary center line C, which connects between a proximal end side B and a distal end side F of the substrate gripping hand 5, is defined on the base plate 51. The substrate gripping hand 5 has a shape that is roughly symmetrical with respect to the center line C serving as an axis of symmetry. An imaginary gripping position G is also defined on the base plate 51. The gripping position G is such a position that when the substrate 10 is positioned at the gripping position G, the center O of the substrate 10 is positioned on the center line C. In the description herein, the center of the gripping position G is referred to as a gripping center CG. When the substrate 10 is positioned at the gripping position G, the center O of the substrate 10 coincides with the gripping center CG. It should be noted that the center line C and the gripping position G may be defined on the substrate gripping hand 5.

The substrate gripping hand 5 further includes: at least one fixed claw 52 provided on the base plate 51; a movable claw 56 configured to move in a reciprocating manner on the center line C at a position that is shifted from the gripping position G to the proximal end side B; a pusher 58 configured to move parallel to the center line C in a reciprocating manner at a position that is shifted from the gripping position G to the proximal end side B; and an actuator 57 configured to cause the movable claw 56 and the pusher 58 to move integrally in a reciprocating manner. The operation of the actuator 57 is controlled by the aforementioned controller 6.

The base plate 51 is a thin and flat spatula-like component. Since a large part of the distal end portion of the base plate 51, through which the center line C extends, is cut out, the overall shape of the base plate 51 is roughly a Y shape (or U shape). The proximal end of the base plate 51 is fixed to the hand base portion 49 by a fastening member or the like.

The fixed claw 52 is disposed at the distal end side F of the gripping center CG of the base plate 51 so that the fixed claw 52 can engage with the edge of the substrate 10 positioned at the gripping position G. In the present embodiment, at the distal end side F of the gripping center CG of the base plate 51, the fixed claw 52 is provided at both sides of the center line C, such that the center line C is positioned between the fixed claws 52. However, the number and positions of fixed claws 52 are not limited to this example.

FIG. 6 is a sectional view taken along line VI-VI of FIG. 4, showing a sectional shape of one fixed claw 52. The structural characteristics of the two fixed claws 52 substantially correspond to each other. Accordingly, the description of only one of the two fixed claws 52 is given below, and the description of the other fixed claw 52 is omitted. As shown in FIG. 6, the fixed claw 52 includes: a pad surface 521, which slopes toward the gripping center CG so as to become closer to a surface R of the base plate 51; a groove portion 522, which is open toward the gripping center CG in a direction parallel to the surface R of the base plate 51; and a claw portion 523, which forms the edge of the groove portion 522. The pad surface 521, the groove portion 522, and the claw portion 523 are formed integrally. The edge of the substrate 10 positioned at the gripping position G is fitted in the groove portion 522. The edge of the substrate 10 fitted in the groove portion 522 is locked by the claw portion 523 so as not to fall out of the groove portion 522.

At the proximal end side B of the gripping center CG of the base plate 51, pads 54 are provided at such positions that the edge of the substrate 10 positioned at the gripping position G or at the vicinity thereof can contact with the pads 54. In the present embodiment, when the substrate gripping hand 5 is in a vertical orientation, one of the pads 54 is positioned above the center line C, and the other two pads 54 are positioned below the center line C. However, the number and positions of pads 54 are not limited to this example.

Figure 7:
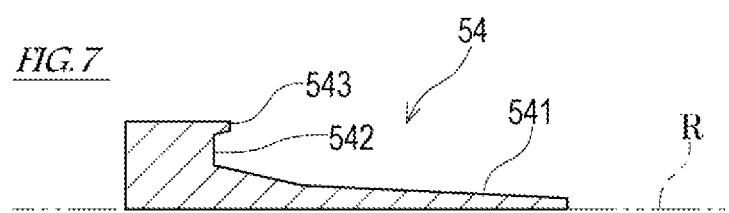
FIG. 7 is a sectional view taken along line VII-VII of FIG. 4

FIG. 7 is a sectional view taken along line VII-VII of FIG. 4, showing a sectional shape of one pad 54. The structural characteristics of the three pads 54 substantially correspond to each other. Accordingly, the description of only one of the three pads 54 is given below, and the description of the other pads 54 is omitted. As shown in FIG. 7, the pad 54 includes: a pad surface 541, which slopes toward the gripping center CG so as to become gradually closer to the surface R of the base plate 51; a groove portion 542, which is open toward the gripping center CG in a direction parallel to the surface R of the base plate 51; and a claw portion 543, which forms the edge of the groove portion 542. The pad surface 541, the groove portion 542, and the claw portion 543 are formed integrally. As the pad surface 541 slopes toward the gripping center CG, the slope angle slightly changes. The edge of the substrate 10 can be fitted in the groove portion 542. The edge of the substrate 10 fitted in the groove portion 542 is locked by the claw portion 543 so as not to fall out of the groove portion 542.

The substrate gripping hand 5 further includes at least one support claw 53 provided on the base plate 51. The support claw 53 is intended for supporting the substrate 10 in a vertical orientation from below when the substrate 10 is at a position that is lower than the gripping position G and shifted from the gripping position G to the proximal end side B. The support claw(s) 53 may be provided separately from the fixed claw(s) 52 and the pad(s) 54, or the fixed claw(s) 52 and/or the pad(s) 54 may double as the support claw(s) 53. In the present embodiment, one support claw 53 is provided at the distal end side F of the gripping center CG of the base plate 51, and two support claws 53 are provided at the proximal end side B of the gripping center CG of the base plate 51. That is, three support claws 53 are provided in total. However, the number and positions of support claws 53 are not limited to this example.

The support claw 53 provided at the distal end side F of the gripping center CG of the base plate 51 is positioned immediately below the fixed claw 52 that is positioned lower than the other fixed claw 52 when the substrate gripping hand 5 is in a vertical orientation. The structural characteristics of the support claw 53 substantially correspond to the above-described structural characteristics of the fixed claw 52. That is, the support claw 53 includes a pad surface 531, a groove portion 532, and a claw portion 533.

The two support claws 53 provided at the proximal end side B of the gripping center CG of the base plate 51 are the two pads 54 that are positioned below the center line C when the substrate gripping hand 5 is in a vertical orientation. The groove portion 542 and the claw portion 543 of each of these two pads 54 function as the support claw 53.

Figure 8:
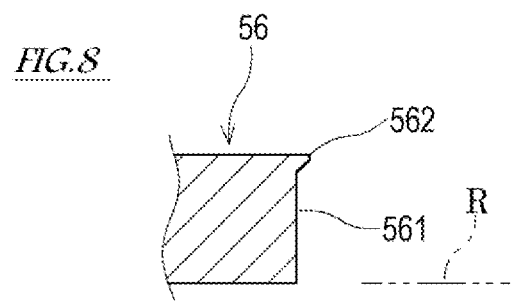
FIG. 8 is a sectional view of a movable claw.
Figure 9:
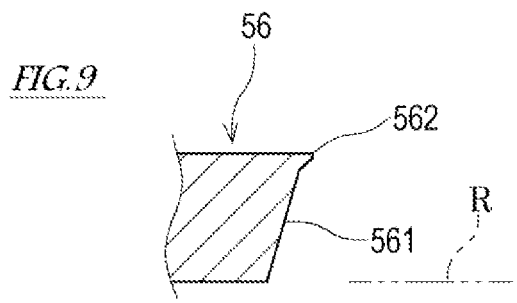
FIG. 9 is a sectional view of the movable claw according to one variation.

FIG. 8 is a sectional view of the movable claw 56, showing a sectional shape of the distal end portion of the movable claw 56. As shown in FIG. 8, the movable claw 56 includes an acting portion 561 and a claw portion 562 provided at the edge of the acting portion 561. The acting portion 561 is a surface orthogonal to the surface R of the base plate 51. However, as an alternative, the acting portion 561 may be a sloped surface that slopes in a manner to face an extended plane of the surface R of the base plate 51 as shown in FIG. 9. The acting portion 561 is operable to act on the edge of the substrate 10 positioned at the gripping position G when the movable claw 56 moves to the distal end side F.

Figure 10:
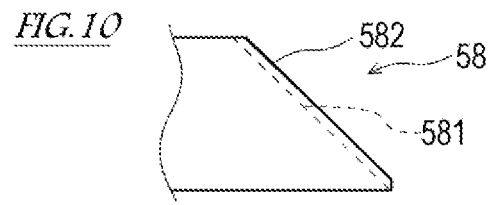
FIG. 10 is a plan view of a pusher.

FIG. 10 is a plan view of the pusher 58. As shown in FIG. 10, the pusher 58 includes an acting portion 581 and a claw portion 582 provided at the edge of the acting portion 581. The acting portion 581 includes an acting surface that faces toward the distal end side F and the center line C. The acting portion 581 is operable to act on the lower edge of the substrate 10 in a vertical orientation, the lower edge being lower than the center O, when the pusher 58 moves to the distal end side F. Since the acting portion 581 of the pusher 58 includes the acting surface that faces toward the distal end side F and the center line C, when the pusher 58 moves forward parallel to the center line C, the substrate 10 in a vertical orientation is lifted toward the distal end side F and the center line C (i.e., lifted diagonally upward).

The movable claw 56 and the pusher 58 are driven by the single actuator 57. The actuator 57 according to the present embodiment is an air cylinder supported by the hand base portion 49. However, the actuator 57 is not limited to an air cylinder, but may be, for example, any one selected from among a power transmission mechanism, a pneumatic cylinder, and a hydraulic cylinder, the power transmission mechanism including, for example, an electric motor and a rack-and-pinion or a ball screw. The operation of the actuator 57 is controlled by the controller 6.

The actuator 57 includes: a rod 72 coupled to a coupling plate 71; and a sleeve 73, in which the rod 72 moves forward and backward. The sleeve 73 is fixed to the hand base portion 49 such that the direction in which the rod 72 extends is parallel to the center line C, and such that the rod 72 is disposed on the extension of the center line C. Accordingly, the rod 72 and the movable claw 56 are arranged on the center line C and on the extension thereof, and pushing force transmitted from the rod 72 to the substrate 10 via the movable claw 56 can be exerted toward the center O of the substrate 10.

The movable claw 56 and the pusher 58 are integrally coupled together by the coupling plate 71 (coupling member), and the end portion of the rod 72 at the distal end side F is connected to the coupling plate 71. Alternatively, the end portion of the rod 72 at the distal end side F may be connected to the movable claw 56. Expanding/contracting motion of the rod 72 driven by the actuator 57 causes the movable claw 56 and the pusher 58 to move integrally in a reciprocating manner parallel to the center line C. When the rod 72 is in a contracted state, the movable claw 56 and the pusher 58 are at their retracted positions. When the rod 72 expands, the movable claw 56 and the pusher 58 move forward, and the movable claw 56 eventually reaches an acting position. Thereafter, when the rod 72 contracts, the movable claw 56 and the pusher 58 move backward, and eventually return to the retracted positions.

The expanding/contracting path of the rod 72 is guided by a guide 74. The guide 74 is formed by a rail member 741 fixed to the hand base portion 49 and a slider member 742 fixed to the rod 72. When the slider member 742 slides on the rail member 741, the rod 72 is guided such that the rod 72 expands/contracts parallel to the center line C. As a result of the path of the rod 72 being guided in this manner, deflection of the path of the reciprocating movement of the movable claw 56 and the pusher 58 coupled to the rod 72 is suppressed.

The position of the movable claw 56, which moves in a reciprocating manner as described above, is detected by a position sensor 75. In the present embodiment, a detecting portion 751 of the position sensor 75 is fixed to the hand base portion 49, and a detected portion 752 of the position sensor 75 is integrally provided on the slider member 742. It should be noted that the detecting portion 751 is an object detecting device of a contact type or a noncontact type, and detects the position of the movable claw 56 by detecting the position of the detected portion 752. Detection signals from the position sensor 75 are outputted to the controller 6.

[Operation of Substrate Transfer Apparatus 1]

Hereinafter, the operation of the substrate transfer apparatus 1 is described, with a focus on the operation of the substrate gripping hand 5. In the description below, although not mentioned specifically, the operations of the manipulator 4 and the substrate gripping hand 5 are controlled by the controller 6.

[Retrieval of Substrate 10 in Vertical Orientation]

First, the operation of retrieving the substrate 10 stored in the substrate vertical-storage container 3 in a vertical orientation from the vertical-storage groove 32 of the substrate vertical-storage container 3 is described.

Figure 11:
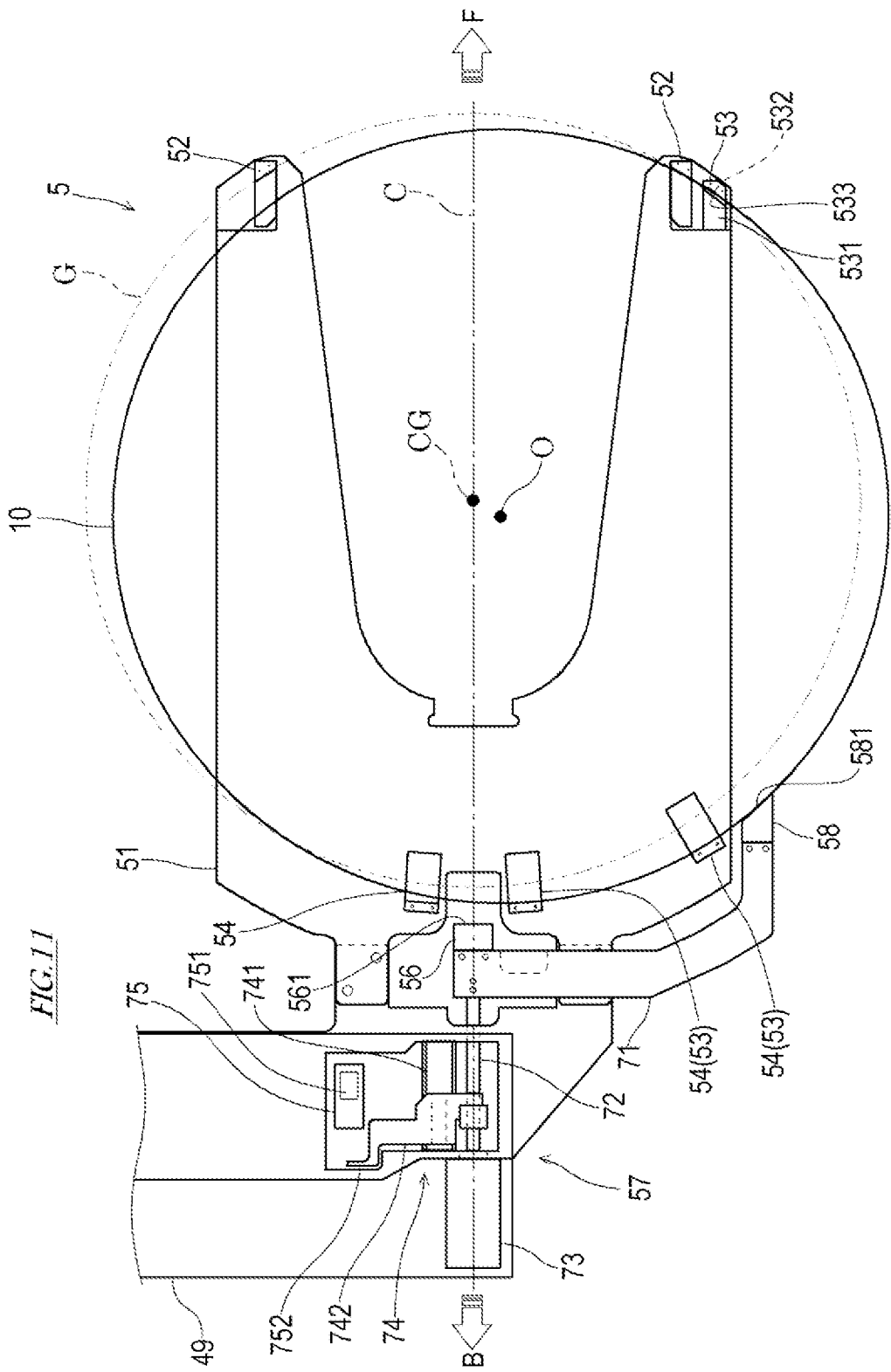
FIG. 11 is a side view showing the substrate gripping hand positioned at a retrieval start position for retrieving a substrate in a vertical orientation.

First, the manipulator 4 operates such that the substrate gripping hand 5 in a vertical orientation moves to a retrieval start position corresponding to the substrate 10 that is placed in the vertical-storage groove 32 in a vertical orientation. FIG. 11 is a side view showing the substrate gripping hand 5 positioned at the retrieval start position for retrieving the substrate 10 in a vertical orientation. As shown in FIG. 11, the substrate gripping hand 5 having moved to the retrieval start position is supporting the substrate 10 in a vertical orientation from below by three support claws 53. The movable claw 56 and the pusher 58 are at their retracted positions. The acting portion 581 of the pusher 58 is either in contact with the edge of the substrate 10 or slightly spaced apart from the edge of the substrate 10 while facing the edge of the substrate 10.

Figure 12:
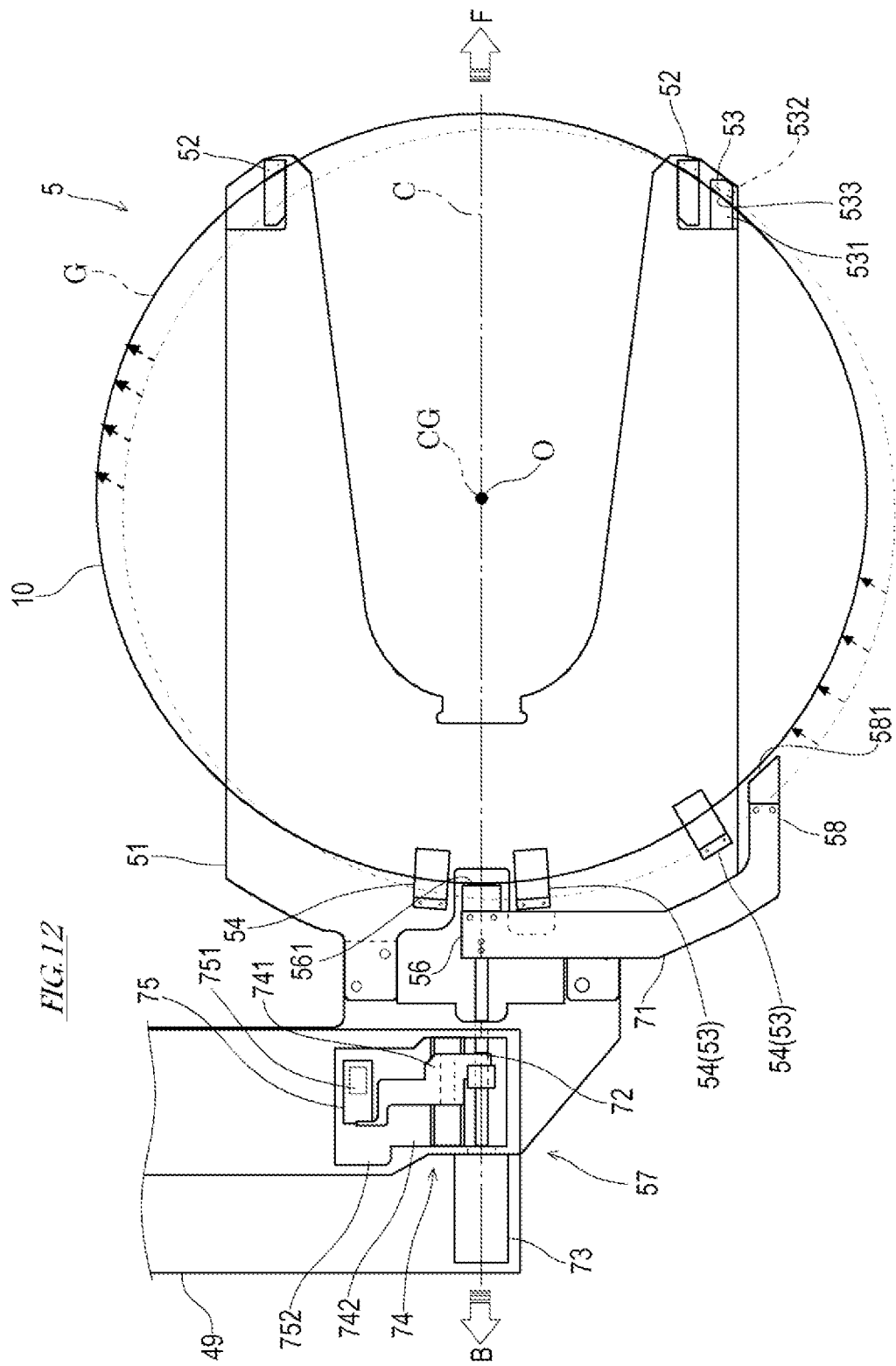
FIG. 12 is a side view showing the substrate gripping hand gripping the substrate in a vertical orientation.

Next, the actuator 57 operates such that the pusher 58 and the movable claw 56 move forward to the distal end side F parallel to the center line C. FIG. 12 is a side view showing the substrate gripping hand 5 gripping the substrate 10 in a vertical orientation. As shown in FIG. 11 and FIG. 12, while the pusher 58 and the movable claw 56 are moving forward, the following processes (1-1) to (1-3) occur.

(1-1) The pusher 58 moving forward to the distal end side F acts on the substrate 10, and as a result, the substrate 10 is lifted until the movement of the substrate 10 is restricted by the fixed claws 52, i.e., lifted to the level of the gripping position G. Here, the substrate 10 moves upward and to the distal end side F in accordance with the forward movement of the pusher 58.

(1-2) After the substrate 10 reaches the level of the gripping position G or immediately before the substrate 10 reaches the level of the gripping position G, the movable claw 56 moving forward to the distal end side F acts on the substrate 10, and as a result, the movable claw 56 and the fixed claws 52 grip the substrate 10 in cooperation with each other.

(1-3) At the same time as or after the movable claw 56 acts on the substrate 10, the acting portion 581 of the pusher 58 moves away from the edge of the substrate 10.

The position of the acting portion 581 of the pusher 58 is shifted to the distal end side F relative to the position of the acting portion 561 of the movable claw 56 such that, during the processes of (1-1) and (1-2), the pusher 58 and the movable claw 56 act on the substrate 10. It should be noted that the distance between the acting portion 581 of the pusher 58 and the acting portion 561 of the movable claw 56 in a direction parallel to the center line C is suitably set based on, for example, the distance between the pusher 58 and the movable claw 56 in a direction orthogonal to the center line C and the size of the substrate 10.

The pusher 58 is disposed away from the movable claw 56 in the direction orthogonal to the center line C, such that the process (1-3) occurs, i.e., such that the pusher 58 does not come into contact with the edge of the substrate 10 positioned at the gripping position G. The distance between the pusher 58 and the movable claw 56 in the direction orthogonal to the center line C is suitably set based on, for example, the distance between the acting portion 581 of the pusher 58 and the acting portion 561 of the movable claw 56 in the direction parallel to the center line C and the size of the substrate 10.

It should be noted that while the movable claw 56 is moving forward, the member that applies pushing force to the substrate 10 is switched from the pusher 58 to the movable claw 56, and thus the pushing force only from one position is applied to the substrate 10 positioned at the gripping position G. As a result, strain and twisting of the substrate 10 are suppressed from occurring. However, even after the movable claw 56 starts acting on the substrate 10, the pusher 58 may continue to act on the substrate, so long as the gripping of the substrate 10 is achieved by the movable claw 56 and the fixed claws 52.

[Feeding of Substrate 10 in Vertical Orientation]

Next, the operation of feeding the substrate 10 in a vertical orientation to the vertical-storage groove 32 of the substrate vertical-storage container 3 is described.

First, the manipulator 4 operates to move the substrate gripping hand 5 gripping the substrate 10 in a vertical orientation to a feeding start position of the vertical-storage groove 32. The substrate gripping hand 5 having moved to the feeding start position is gripping the substrate 10 by one movable claw 56 and two fixed claws 52. The acting portion 581 of the pusher 58 is slightly spaced apart from the edge of the substrate 10 while facing the edge of the substrate 10.

Next, the actuator 57 operates such that the pusher 58 and the movable claw 56 move backward to the proximal end side B parallel to the center line C. While the pusher 58 and the movable claw 56 are moving backward, the following processes (2-1) to (2-3) occur. (2-1) As a result of the movable claw 56 moving backward to the proximal end side B, the gripping of the substrate 10 is released.

(2-2) When the gripping of the substrate 10 is released, the substrate 10 starts to fall freely. At the time, the edge of the substrate 10 comes into contact with the acting portion 581 of the pusher 58, and thereby the movement of the substrate 10 is restricted. That is, in accordance with the backward movement of the pusher 58 to the proximal end side B, the substrate 10 moves downward and to the proximal end side B while being supported by the pusher 58 from below.

(2-3) While the substrate 10 is moving downward and to the proximal end side B, the edge of the substrate 10 comes into contact with the support claws 53, and then, after being temporarily supported by the support claws 53, the substrate 10 falls into the vertical-storage groove 32.

In the above-described operation of feeding the substrate 10 in a vertical orientation, since the movement of the substrate 10 supported by the support claws 53 in a direction penetrating the main surface of the substrate 10 is not restricted, even if there is a positional error in the horizontal direction between the gripping position G of the substrate gripping hand 5 and the vertical-storage groove 32, the substrate 10 smoothly falls into the vertical-storage groove 32 without being twisted.

[Retrieval of Substrate 10 in Horizontal Orientation]

The substrate gripping hand 5 is capable of handling not only the substrate 10 in a vertical orientation but also the substrate 10 in a horizontal orientation. Hereinafter, the operation of retrieving the substrate 10 in a horizontal orientation from the horizontal-storage groove 22 of the substrate horizontal-storage container 2 is described.

First, the manipulator 4 operates to move the substrate gripping hand 5 in a horizontal orientation to a retrieval start position of the horizontal-storage groove 22. The retrieval start position of the horizontal-storage groove 22 is a position immediately below the horizontal-storage groove 22. Then, the substrate gripping hand 5 at the retrieval start position moves slightly upward, and thereby the substrate 10 to be retrieved is scooped up by the base plate 51. The edge of the substrate 10 scooped up by the base plate 51 contacts with the pad surfaces 521 of the fixed claws 52, the pad surface 531 of the support claw 53, and the pad surfaces 541 of the pads 54.

Next, the actuator 57 operates such that the pusher 58 and the movable claw 56 move from their retracted positions to the distal end side F parallel to the center line C. Here, in a case where the center O of the substrate 10 is on the center line C or on the extension of the center line C, the pusher 58 does not act on the substrate 10, but the movable claw 56 pushes the substrate 10 to the distal end side F, and as a result, the movable claw 56 and the fixed claws 52 grip the substrate 10 in cooperation with each other. On the other hand, in a case where the center O of the substrate 10 is neither on the center line C nor on the extension of the center line C, the following processes (3-1) to (3-3) occur while the pusher 58 and the movable claw 56 are moving forward.

(3-1) The pusher 58 moving forward acts on the substrate 10, and as a result, the substrate 10 is moved to the gripping position G.

(3-2) After or immediately before the substrate 10 reaches the gripping position G, the movable claw 56 moving forward acts on the substrate 10, and as a result, the movable claw 56 and the fixed claws 52 grip the substrate 10 in cooperation with each other.

(3-3) At the same time as or after the movable claw 56 acts on the substrate 10, the pusher 58 moves away from the edge of the substrate 10. However, even after the movable claw 10 starts acting on the substrate 10, the pusher 58 may continue to act on the substrate, so long as the gripping of the substrate 10 is achieved by the movable claw 56 and the fixed claws 52.

In the above-described operation of retrieving the substrate 10 in a horizontal orientation, even if there is a positional error in the horizontal direction between the substrate 10 scooped up by the base plate 51 and the gripping position G, the positional error is corrected by the action of the pusher 58, and then the movable claw 56 acts on the substrate 10. This makes it possible to cause the movable claw 56 to act on the edge of the substrate 10 positioned at the gripping position G, the edge passing the center line C. The movable claw 56 acting on the substrate 10 in this manner can exert pushing force toward the center O of the substrate 10. This makes it possible to smoothly retrieve the substrate 10 placed in the horizontal-storage groove 22 from the groove 22 without causing local strain and twisting of the substrate 10.

[Feeding of Substrate 10 in Horizontal Orientation]

Next, the operation of feeding the substrate 10 in a horizontal orientation to the horizontal-storage groove 22 of the substrate horizontal-storage container 2 is described.

First, the manipulator 4 operates to move the substrate gripping hand 5 gripping the substrate 10 in a horizontal orientation to a feeding start position of the horizontal-storage groove 22. The feeding start position of the horizontal-storage groove 22 is a position immediately above the horizontal-storage groove 22, in which the substrate 10 is to be placed. The substrate gripping hand 5 having moved to the feeding start position is gripping the substrate 10 by one movable claw 56 and two fixed claws 52, and the movable claw 56 is at its acting position.

Next, the actuator 57 operates such that the pusher 58 and the movable claw 56 move to the proximal end side B parallel to the center line C. While the pusher 58 and the movable claw 56 are moving backward in this manner, the following processes (4-1) to (4-3) occur.

(4-1) As a result of the movable claw 56 moving backward, the gripping of the substrate 10 is released.

(4-2) When the gripping of the substrate 10 is released, the substrate 10 falls freely, and then the substrate 10 comes into contact with and is supported by the pad surfaces 521 of the fixed claws 52, the pads 54, and the support claw 53.

At last, the substrate gripping hand 5 moves slightly downward, and thereby the substrate 10 is placed into the horizontal-storage groove 22. Here, since the movement of the substrate 10 is not restricted, even if there is a positional error in the horizontal direction between the gripping position G of the substrate gripping hand 5 and the horizontal-storage groove 22, the substrate 10 is smoothly placed into the horizontal-storage groove 22 without being twisted.

As described above, the substrate gripping hand 5 according to the present embodiment includes: the base plate 51, on which the center line C and the gripping position G are defined, the center line C extending from the proximal end side B to the distal end side F, the gripping position G being such a position that when the substrate 10 is positioned at the gripping position G, the center O of the substrate 10 is positioned on the center line C; at least one fixed claw 52 provided on the base plate 51 at the distal end side F, the fixed claw 52 being engageable with the edge of the substrate 10 positioned at the gripping position G; the movable claw 56, which includes the acting portion 561 operable to act on the edge of the substrate 10 positioned at the gripping position G, the movable claw 56 moving in a reciprocating manner on the center line C at a position that is shifted from the gripping position G to the proximal end side B; the pusher 58, which includes the acting portion 581 operable to act on the lower edge of the substrate 10 in a vertical orientation, the lower edge being lower than the center of the substrate 10, the pusher 58 moving parallel to the center line C in a reciprocating manner at a position that is shifted from the gripping position G to the proximal end side B; and the actuator 57 configured to cause the movable claw 56 and the pusher 58 to move integrally in a reciprocating manner. The position of the acting portion 581 of the pusher 58 is shifted to the distal end side F relative to the position of the acting portion 561 of the movable claw 56, such that after the pusher 58 moving forward to the distal end side F acts on the substrate 10 in a vertical orientation to lift the substrate 10 to the gripping position G, the movable claw 56 moving forward acts on the substrate 10 in such a manner that the movable claw 56 and the fixed claw 52 grip the substrate 10 in cooperation with each other.

The substrate transfer apparatus 1 according to the present embodiment further includes: the substrate gripping hand 5; and the manipulator 4 mounted with the substrate gripping hand 5, which is attached to the hand end portion of the manipulator 4.

In the substrate transfer apparatus 1 and the substrate gripping hand 5, in the case of retrieving the substrate 10 in a vertical orientation from the vertical-storage groove 32, the pusher 58 acts on the substrate 10, and thereby the substrate 10 is lifted to the level of the gripping position G. Thereafter, the movable claw 56 acts on the substrate 10. Therefore, even if there is a positional error in the vertical direction and/or the horizontal direction between the substrate 10 placed in the vertical-storage groove 32 and the gripping position G defined on the substrate gripping hand 5, such positional error is corrected by the action of the pusher 58, and the movable claw 56 can be caused to act on the vertically central edge of the substrate 10. The movable claw 56 acting on the substrate 10 in this manner can exert pushing force toward the center O of the substrate 10. This makes it possible to smoothly retrieve the substrate 10 placed in the vertical-storage groove 32 in a vertical orientation from the groove 32 without causing local strain and twisting of the substrate 10.

Moreover, since the movable claw 56 and the pusher 58 operate integrally, the timing at which the movable claw 56 acts on the substrate 10 and the timing at which the pusher 58 acts on the substrate 10 are predetermined in relation to each other. Therefore, it is not necessary to separately control the operation of the movable claw 56 and the operation of the pusher 58, and thus the control of the operation of the movable claw 56 and the pusher 58 is simplified. Furthermore, since the movable claw 56 and the pusher 58 are driven by the single actuator 57, the initial cost and energy consumption of the actuator 57 can be reduced compared to a case where the actuator 57 is provided for each of the movable claw 56 and the pusher 58. Such reduction of components of the substrate gripping hand 5 contributes to the reduction of the size of the substrate gripping hand 5 and the substrate transfer apparatus 1.

In the substrate gripping hand 5 according to the above-described embodiment, the acting portion 581 of the pusher 58 includes the acting surface that faces toward the distal end side F and the center line C.

Accordingly, the substrate 10 can be moved toward the distal end side F and the center line C by the pusher 58 moving forward parallel to the center line C.

Further, in the substrate gripping hand 5 according to the above-described embodiment, the pusher 58 is disposed away from the movable claw 56 in the direction orthogonal to the center line C, such that the pusher 58 does not come into contact with the edge of the substrate 10 positioned at the gripping position G.

Accordingly, pushing force is applied by the movable claw 56 to the substrate 10 positioned at the gripping position G, and thereby local strain and twisting of the substrate 10 can be suppressed from occurring.

Still further, in the substrate gripping hand 5 according to the above-described embodiment, the movable claw 56 and the pusher 58 are integrally coupled together by the coupling plate 71 (coupling member), and the actuator 57 includes the rod 72, which is disposed on the extension of the center line C and coupled to the coupling plate 71.

Accordingly, the rod 72, the movable claw 56, and the center O of the substrate 10 positioned at the gripping position G are arranged on the center line C and on the extension thereof, and the movable claw 56 and the fixed claws 52 grip the substrate 10 without causing local strain and twisting of the substrate 10.

Still further, the substrate gripping hand 5 according to the above-described embodiment further includes at least one support claw 53 provided on the base plate 51, the support claw 53 supporting the substrate 10 in a vertical orientation when the substrate 10 is at a position that is lower than the gripping position G and shifted from the gripping position G to the proximal end side B.

Accordingly, non-restricting supporting of the substrate 10 by the support claw 53 can be performed between the placement of the substrate 10 in a vertical orientation in the vertical-storage groove 32 and the gripping of the substrate 10 at the gripping position G by the fixed claws 52 and the movable claw 56. Therefore, even if there is a positional error between the vertical-storage groove 32 and the gripping position G of the substrate gripping hand 5, the positional error can be absorbed.

In the above-described embodiment, at least one of the support claws 53 includes a pad surface that slopes toward the center of the gripping position G (the gripping center CG) so as to become gradually closer to the surface R of the base plate 51. The pad surface corresponds to the pad surface 531 of the support claw 53 and/or the pad surface 541 of the pad 54.

Accordingly, the edge of the substrate 10 placed on the substrate gripping hand 5 contacts with the pad surface 541 and/or the pad surface 531, and the front and back surfaces of the substrate 10 do not contact with the base plate 51 and the support claw 53 (pad 54). Therefore, contamination of the substrate 10 can be suppressed. Moreover, since the support claw 53 (pad 54) is provided with the pad surface 531 (pad surface 541), the single member has the functions of both the support claw 53 and the pad. This makes it possible to reduce the number of components.

Although the preferred embodiment of the present invention is as described above, the above-described configuration can be modified, for example, as described below.

Figure 13:
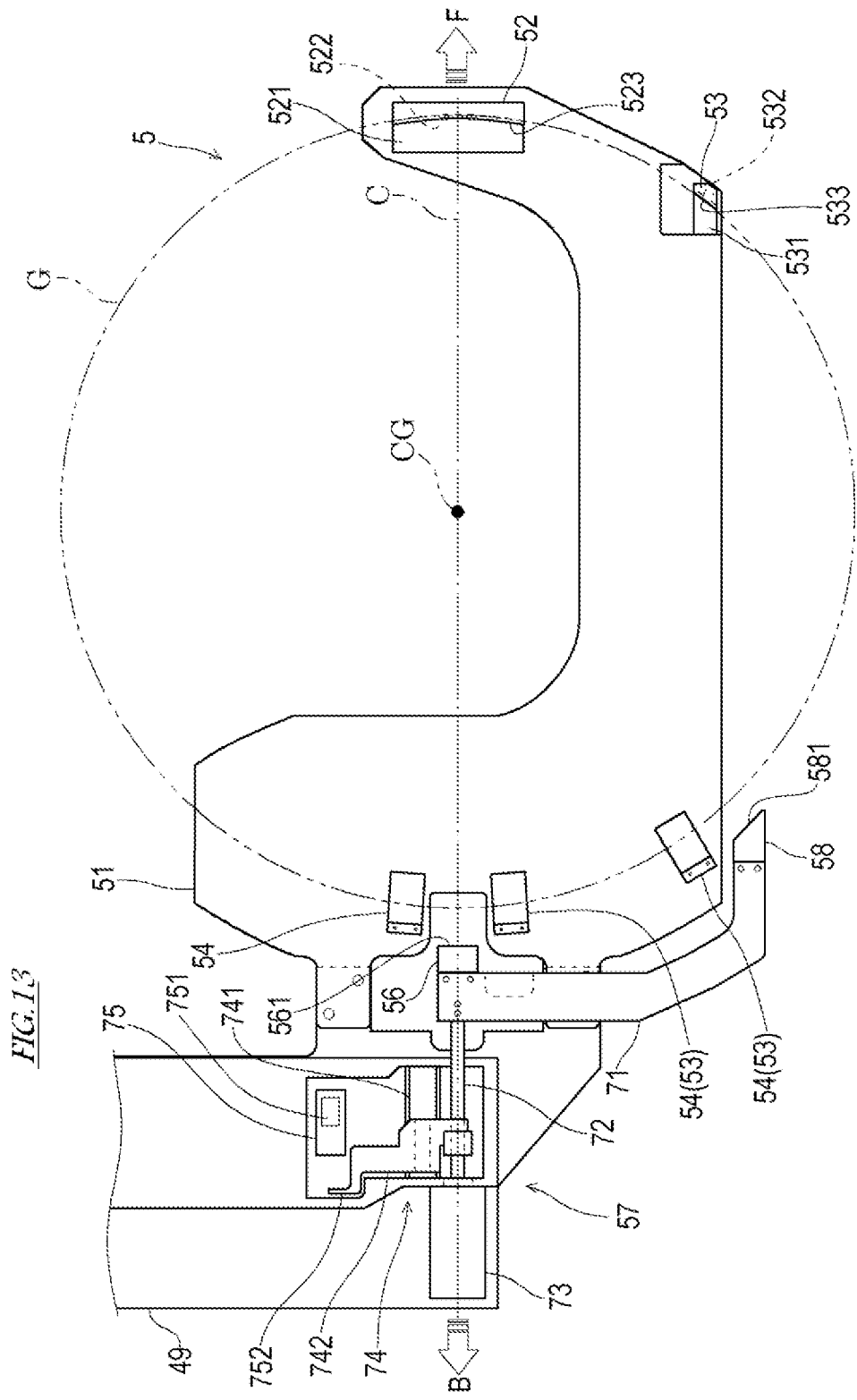
FIG. 13 is a plan view of the substrate gripping hand including a fixed claw according to one variation.

The substrate gripping hand 5 according to the above-described embodiment is provided with a plurality of fixed claws 52. However, as an alternative, the number of fixed claws 52 may be one. For example, as shown in FIG. 13, one fixed claw 52 may be provided on a part of the base plate 51 at the distal end side F.

Figure 14:
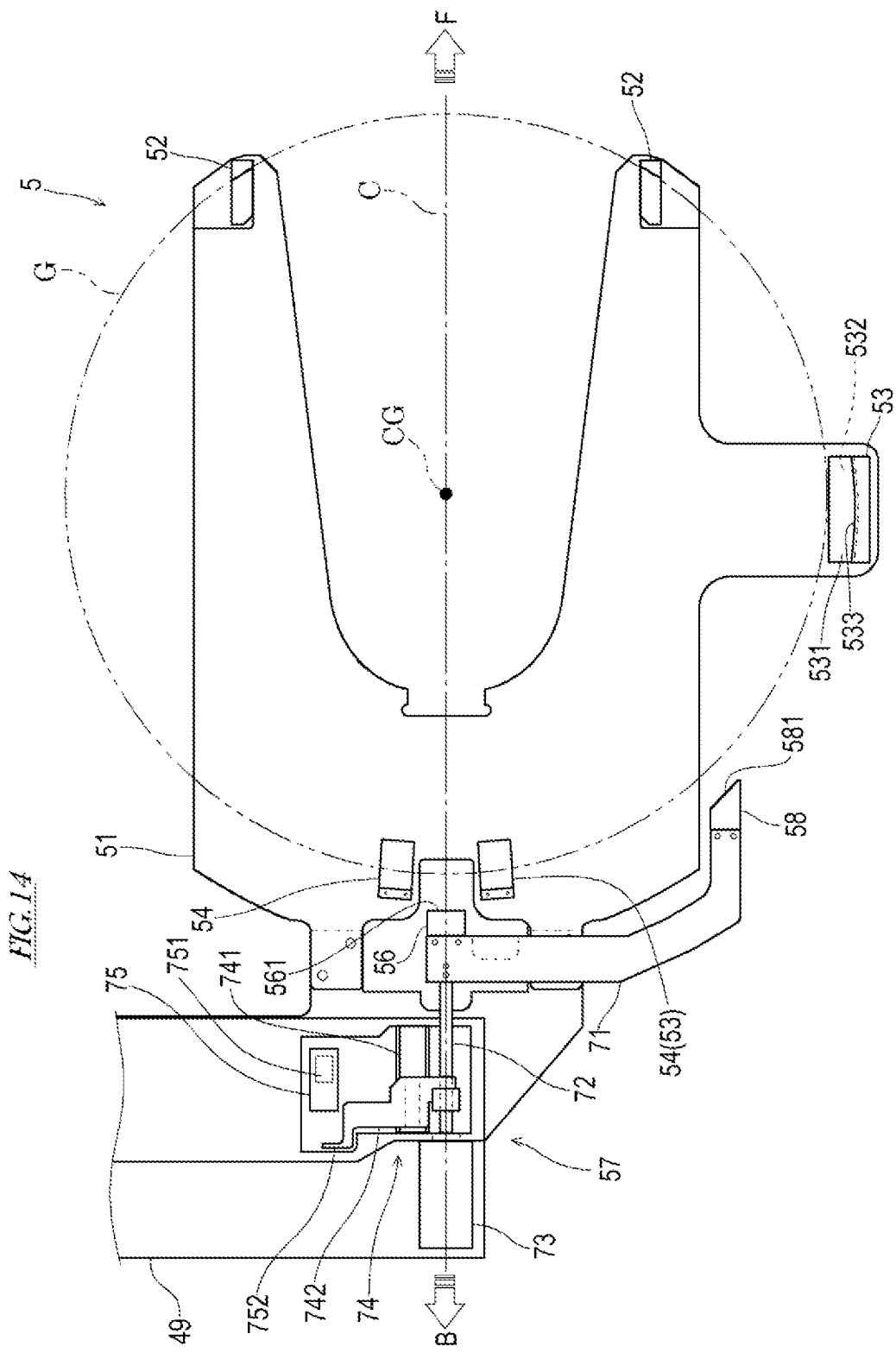
FIG. 14 is a plan view of the substrate gripping hand including a support claw according to one variation.

The substrate gripping hand 5 according to the above-described embodiment is provided with a plurality of support claws 53. However, as an alternative, the number of support claws 53 may be one. For example, as shown in FIG. 14, one support claw 53 may be provided on the lower part of the base plate 51 in a vertical orientation.

In the substrate gripping hand 5 according to the above-described embodiment, the movable claw 56 and the pusher 58 are both coupled to the coupling plate 71, and thereby the movable claw 56 and the pusher 58 are integrated together. However, as an alternative, the movable claw 56, the pusher 58, and the coupling plate 71 may be integrally formed together. In this case, for example, the movable claw 56, the pusher 58, and the coupling plate 71 may be realized as an integrally formed component made of resin.

In the substrate gripping hand 5 according to the above-described embodiment, the fixed claws 52 and the support claw 53 provided on the base plate 51 at the distal end side F of the gripping center CG are separate members. However, instead of the fixed claws 52 and the support claw 53, a single member that has the functions of these claws may be provided on the base plate 51.

From the foregoing description, numerous modifications and other embodiments of the present invention are obvious to a person skilled in the art. Therefore, the foregoing description should be interpreted only as an example and is provided for the purpose of teaching the best mode for carrying out the present invention to a person skilled in the art. The structural and/or functional details may be substantially altered without departing from the spirit of the present invention.

REFERENCE SIGNS LIST 1 substrate transfer apparatus
2 substrate horizontal-storage container
3 substrate vertical-storage container
4 manipulator
5 substrate gripping hand
6 controller
10 substrate
22 horizontal-storage groove
32 vertical-storage groove
49 hand base portion
51 base plate
52 fixed claw
53 support claw
54 pad
56 movable claw
57 actuator
58 pusher
71 coupling plate
72 rod
74 guide
75 position sensor
561 acting portion
562 claw portion
581 acting portion
582 claw portion
B proximal end side
C center line F distal end side
G gripping position
O center

The invention claimed is:

1. A substrate gripping hand for gripping a disc-shaped substrate, comprising:
   a base plate on which a center line and a gripping position are defined, the center line extending from a proximal end side to a distal end side, the gripping position being such a position that when the substrate is positioned at the gripping position, a center of the substrate is positioned on the center line;
   at least one fixed claw provided on the base plate at the distal end side, the fixed claw being engageable with an edge of the substrate positioned at the gripping position;
   a movable claw that includes an acting portion operable to act on the edge of the substrate positioned at the gripping position, the movable claw moving in a reciprocating manner on the center line at a position that is shifted from the gripping position to the proximal end side;
   a pusher that includes an acting portion operable to act on a lower edge of the substrate in a vertical orientation, the lower edge being lower than the center of the substrate, the pusher moving parallel to the center line in a reciprocating manner at a position that is shifted from the gripping position to the proximal end side; and
   an actuator configured to cause the movable claw and the pusher to move integrally in a reciprocating manner, wherein
   a position of the acting portion of the pusher is shifted to the distal end side relative to a position of the acting portion of the movable claw, such that after the pusher moving forward to the distal end side acts on the substrate in a vertical orientation to lift the substrate to the gripping position, the movable claw moving forward acts on the substrate in such a manner that the movable claw and the fixed claw grip the substrate in cooperation with each other.

2. The substrate gripping hand according to claim 1, wherein
   the pusher is disposed away from the edge of the substrate positioned at the gripping position in a direction orthogonal to the center line in a state in which the movable claw and the fixed claw grip the substrate in cooperation with each other.

3. The substrate gripping hand according to claim 1, further comprising at least one support claw provided on the base plate, the support claw supporting the substrate in a vertical orientation when the substrate is at a position that is lower than the gripping position and shifted from the gripping position to the proximal end side.

4. A substrate transfer apparatus comprising:
   the substrate gripping hand according to claim 1; and
   a manipulator mounted with the substrate gripping hand, which is attached to a hand end portion of the manipulator.

* * * * *